(12) United States Patent
Tanaka et al.

(10) Patent No.: US 8,737,541 B2
(45) Date of Patent: May 27, 2014

(54) DECODING APPARATUS, DECODING METHOD AND RECORDING MEDIUM

(75) Inventors: Nobuyuki Tanaka, Tokyo (JP); Masao Orio, Tokyo (JP)

(73) Assignees: NEC Corporation, Tokyo (JP); NTT DoCoMo, Inc., Tokyo (JP)

( * ) Notice: Subject to any disclaimer, the term of this patent is extended or adjusted under 35 U.S.C. 154(b) by 67 days.

(21) Appl. No.: 13/501,189

(22) PCT Filed: Oct. 12, 2010

(86) PCT No.: PCT/JP2010/068235
§ 371 (c)(1),
(2), (4) Date: Apr. 10, 2012

(87) PCT Pub. No.: WO2011/046225
PCT Pub. Date: Apr. 21, 2011

(65) Prior Publication Data
US 2012/0201334 A1    Aug. 9, 2012

(30) Foreign Application Priority Data

Oct. 16, 2009  (JP) .................................. 2009-239330

(51) Int. Cl.
*H04L 27/06* (2006.01)
(52) U.S. Cl.
USPC ........... 375/340; 375/316; 375/347; 375/267; 375/349; 375/341; 714/781; 714/752
(58) Field of Classification Search
USPC ................. 375/340, 316, 341, 347, 267, 349; 714/781, 752
See application file for complete search history.

(56) References Cited

U.S. PATENT DOCUMENTS

| 2001/0034871 A1* | 10/2001 | Takeda et al. ................. 714/781 |
| 2003/0088819 A1 | 5/2003 | Uga |
| 2008/0198953 A1 | 8/2008 | Yokokawa et al. |
| 2009/0015443 A1 | 1/2009 | Zhang et al. |

FOREIGN PATENT DOCUMENTS

| JP | 2006-173724 | 6/2006 |
| JP | 3914877 | 2/2007 |
| JP | 2008-205579 | 9/2008 |
| WO | WO 2009/008685 | 1/2009 |

OTHER PUBLICATIONS

International Search Report, PCT/JP2010/068235, Nov. 22, 2010.
Samsung, Coding for CCFI Transmission, 3GPP TSG RAN WG1 Meeting #49bis R1-073098, Jun. 25, 2007, pp. 1-3.
Motorola, Coding and Transmission of Control Channel Format Indicator, 3GPP TSG RAN1 #49-bis R1-072692, Jun. 25, 2007, pp. 1-5.

(Continued)

*Primary Examiner* — Zewdu Kassa
(74) *Attorney, Agent, or Firm* — Young & Thompson

(57) ABSTRACT

Provided is a decoding apparatus capable of reducing the error rate of the decoding results and also the circuit scale. A computing unit computes a plurality of distances only for a number of code word candidates of code words from demodulated data, the number being smaller than a number of values the code words can express, the code words having a possibility of being transmitted. A decoding unit decodes the code words from the plurality of computed distances. This invention is applicable to a decoding apparatus for Long Term Evolution (LTE).

8 Claims, 6 Drawing Sheets

(56) References Cited

OTHER PUBLICATIONS

Huawei, CMCC, ZTE, HTC, Unicast transmission in MBSFN subframes, 3GPP TSG-RAN-WG1 Meeting #58bis R1-093826, Oct. 12, 2009, pp. 1-4.

NTT DOCOMO, "Views on Solution to PCFICH Detection Error", 3GPP TSG RAN WG1 Meeting #58bis, R1-094237, Oct. 12, 2009, pp. 1-5.

Extended European Search Report dated Mar. 21, 2013, with English Translation; Application No. 10823493.1.

J. Wolf: "Efficient maximum likelihood decoding of linear block codes using a trellis", IEEE Transactions on Information Theory, vol. 24, No. 1, Jan. 1, 1978, pp. 76-80, XP055056182.

A. D. Abbaszadeh et al.: "VLSI Implementation of a Maximum-Likelihood Decoder for the Golay (24, 12) Code", IEEE Journal on Selected Areas in Communications, IEEE Service Center, Piscataway, US, vol. 6, No. 3, Apr. 1, 1988, pp. 558-565, XP000879645.

DRAFT3GPP TS 36.212 V8.7.0 (May 2009), 3rd Generation Partnership Project; Technical Specification Group Radio Access Network; Evolved Universal Terrestrial Radio Access (E-UTRA); Multiplexing and channel coding (Release 8), Mobile Competence Centre; 650, Route Des Lucioles; F-06921 Sophia-Antipolis Cedex; France, Jun. 2, 2009, XP050338735.

Huawei et al.: "Unicast transmission in MBMS subframe", 3GPP Draft; R2-094421 Unicast Transmission in MBMS Subframes, 3rd Generation Partnership Project (3GPP), Mobile Competence Centre; 650, Route Des Lucioles; F-06921 Sophia-Antipolis Cedex; France, Aug. 17,2009, XP050352619.

Japanese Official Action—2011-536204—Mar. 12, 2014.

* cited by examiner

US 8,737,541 B2

DECODING APPARATUS, DECODING METHOD AND RECORDING MEDIUM

TECHNICAL FIELD

This invention relates to a decoding apparatus and a decoding method, and a recording medium.

BACKGROUND ART

In Long Term Evolution (LTE), a physical control format indicator channel (PCFICH) is used as a control channel. The PCFICH notifies a receiving terminal of the number of orthogonal frequency division multiplexing (OFDM) symbols with which a physical downlink control channel (PDCCH) is to be transmitted. The receiving terminal is notified of the number of OFDM symbols as a control format indicator (CFI). A code word of the CFI consists of 3 bits. When a value of the CFI is 1, the code word is expressed as "011" in binary. When the value of the CFI is 2, the code word is expressed as "101" in binary. When the value of the CFI is 3, the code word is expressed as "110" in binary. When the value of the CFI is 4, the code word is expressed as "000" in binary.

On the transmission side, the CFI is further converted to repetition codes to generate a 32-bit transmission signal sequence. The receiving terminal receives the 32-bit transmission signal sequence, decodes the repetition codes of the 32-bit transmission signal sequence, and then decodes the CFI. As a decoding method, soft decision decoding is commonly used. In the case of the PCFICH, distances between decoding results of the repetition codes and respective code word candidates are calculated, and the CFI corresponding to the code word candidate having the highest correlation is produced as a decoding result.

Note that, the PDCCH is a control channel for transmitting control information for receiving a physical downlink shared channel (PDSCH) by the receiving terminal. The PDSCH is a channel for transmitting packet data to the receiving terminal.

FIG. 6 illustrates the CFI that has been converted to the repetition codes. First, a 32-bit sequence $C_{PCFICH}^{softbit}(i)$ for decoding the repetition codes is divided into eleven units of 3 bits. Note, however, that the 11th unit contains 2 bits. Each of the bits in a unit corresponds to a code word of the CFI. In decoding the repetition codes, the eleven units are summed for each of the bits. It is assumed that the decoding results of the repetition codes are first to third sums A, B, and C, the first to third sums A, B, and C are expressed by Equations (1):

$A = \Sigma C_{PCFICH}^{softbit}(i)$ where $i = 0, 3, 6, 9, \ldots 30$ $B = \Sigma C_{PCFICH}^{softbit}(i)$ where $i = 1, 4, 7, 10, \ldots 31$ $C = \Sigma C_{PCFICH}^{softbit}(i)$ where $i = 2, 5, 8, 11, \ldots 29$ Eqs. (1)

In the soft decision decoding, distances from the code word candidates are taken. At this time, '0' and '1' each constituting 1 bit of the code word are converted to +1 and −1 for transmission, respectively, and hence Euclidean distances are taken on the receiving terminal side. When the Euclidean distances from the respective code word candidates are denoted as first to fourth Euclidean distances $P_{CFI1}$, $P_{CFI2}$, $P_{CFI3}$, and $P_{CFI4}$, respectively, the first to fourth Euclidean distances $P_{CFI1}$, $P_{CFI2}$, $P_{CFI3}$, and $P_{CFI4}$ are expressed by Equations (2):

$P_{CFI1} = A - B - C$ $P_{CFI2} = -A + B - C$ $P_{CFI3} = -A - B + C$ $P_{CFI4} = A + B + C$ Eqs. (2)

From the plurality of distances, the CFI corresponding to the code word candidate having the highest correlation is decoded by the computation expressed by Equation (3):

$$CFI = \begin{cases} 1 & \text{if } P_{CFI1} = \text{Max}(P_{CFI1}, P_{CFI2}, P_{CFI3}, P_{CFI4}) \\ 2 & \text{if } P_{CFI2} = \text{Max}(P_{CFI1}, P_{CFI2}, P_{CFI3}, P_{CFI4}) \\ 3 & \text{if } P_{CFI3} = \text{Max}(P_{CFI1}, P_{CFI2}, P_{CFI3}, P_{CFI4}) \\ 4 & \text{if } P_{CFI4} = \text{Max}(P_{CFI1}, P_{CFI2}, P_{CFI3}, P_{CFI4}) \end{cases}$$ Eq. (3)

Japanese Unexamined Patent Application Publication (JP-A) No. 2006-173724 (hereinafter, referred to as "Patent Document 1") discloses a decoding apparatus capable of significantly reducing an amount of calculation in the trellis or turbo-trellis coded modulation scheme. The trellis decoding apparatus disclosed in Patent Document 1 includes a decoder, a hard decision block, and a high-order bit decoder. The decoder comprises squared Euclidean distance calculation means, branch metric calculation means, and forward path metric calculation means. The squared Euclidean distance calculation means specifies a representative metric with respect to a received signal by referring to a lookup table for specifying a candidate signal point to calculate a squared Euclidean distance. The branch metric calculation means calculates a branch metric obtained by inverting the sign of the squared Euclidean distance. The forward path metric calculation means calculates a path metric in time series. The hard decision block performs a hard decision on the path metric to determine 3 low-order bits. The high-order bit decoder decodes high-order bits with the 3 low-order bits and the received signal.

However, in the LTE, the CFI having the value of 4 is never transmitted under the specification. In the case of a Multimedia Broadcast and Multicast Service (MBMS) single frequency network (MBSFN) sub-frame, the CFI having the value of 3 is never transmitted, either. In such case, simple soft decision decoding of the CFIs as in Equation (3) may lead to deterioration of the error rate and an increase in circuit scale.

Specifically, in the case where there is data that is never transmitted and the data may be discriminated in the receiving terminal, when the received transmission signal sequence is simply decoded, the data that is never transmitted may be produced as the decoding result to deteriorate the error rate.

SUMMARY OF THE INVENTION

In view of the above-mentioned circumstances, according to this invention, in the case where there is data that is never transmitted and the data may be discriminated in the receiving terminal, code word candidates corresponding to the data are removed from the subject to be decoded, to thereby reduce the error rate of the decoding results. Further, according to this invention, in the case where there is data that is never transmitted and the data is fixed, the circuit scale may also be reduced.

It is therefore an object of this invention to solve the above-mentioned problem, that is, to provide a decoding apparatus and a decoding method, and a recording medium capable of reducing the error rate of the decoding results and also the circuit scale.

In order to solve the above-mentioned problem, a decoding apparatus of this invention includes: a computing unit for computing a plurality of distances only for a number of code word candidates of code words from demodulated data, the number being smaller than a number of values the code words can express, the code words having a possibility of being transmitted; and a decoding unit for decoding the code words from the plurality of computed distances.

According to this invention, it is possible to provide a decoding apparatus capable of reducing the error rate of the decoding results and also the circuit scale.

MODE FOR CARRYING OUT THE INVENTION

Hereinafter, a communication system according to an exemplary embodiment of this invention is described with reference to FIGS. 1 to 5.

Figure 1:
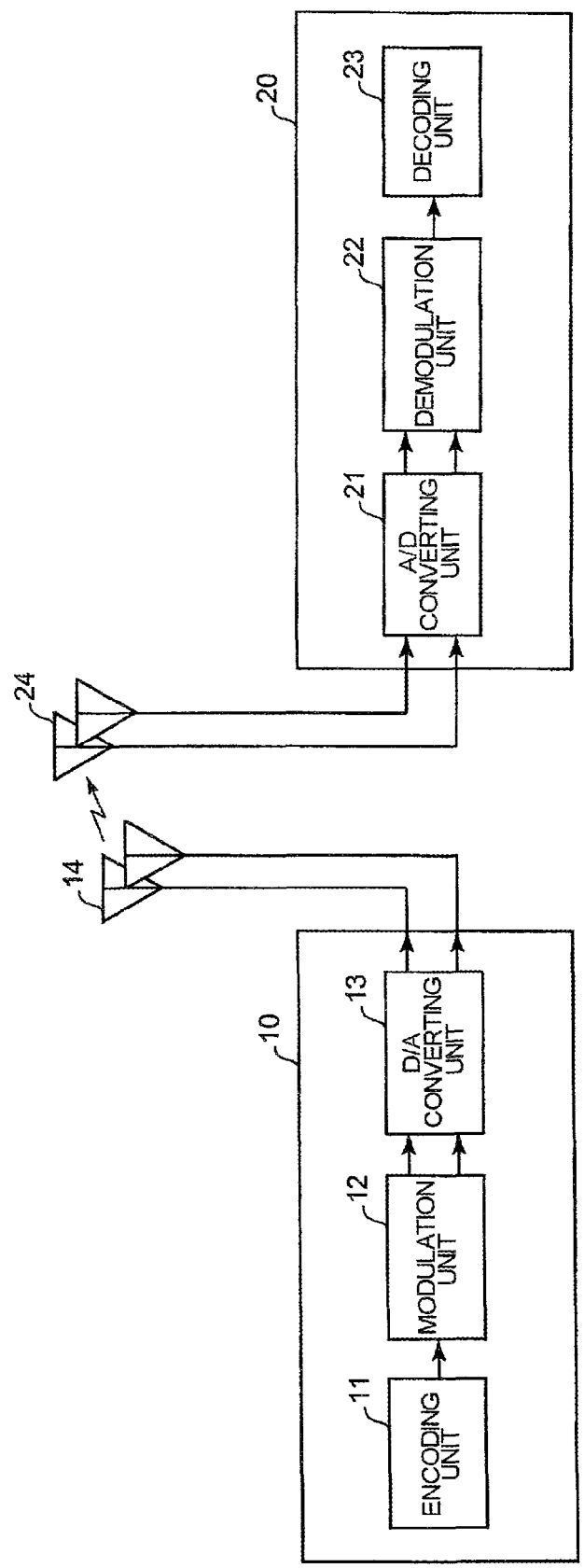
FIG. 1 is a block diagram illustrating an overall configuration of a communication system.

FIG. 1 is a block diagram illustrating an overall configuration of the communication system according to an exemplary embodiment of this invention. As illustrated in FIG. 1, a transmission side is, for example, a base station 10. The base station 10 comprises an encoding unit 11, a modulation unit 12, a digital/analog (D/A) converting unit 13, and a plurality of antennas 14. A receiving side is, for example, a user terminal 20. The user terminal 20 comprises a plurality of antennas 24, an analog/digital (A/D) converting unit 21, a demodulation unit 22, and a decoding unit (decoding apparatus) 23.

In the base station 10, for example, a central processing unit (CPU) (not shown) of the base station 10 first supplies data to be transmitted as information bits to the encoding unit 11. The encoding unit 11 performs encoding processing called block coding, in which a code word corresponding to a CFI is repeated for a predetermined number of bits. For example, in the specification of the LTE, the code word corresponding to CFI=1 is 011 and has a code length of 32 bits. When the information bit corresponding to the value of 1 is supplied as the CFI, the encoding unit 11 encodes the supplied information bit to 011 011 011 011 011 011 011 011 011 011 01. The modulation unit 12 modulates the supplied code data and delivers a plurality of pieces of modulated data, which is obtained by modulating the input code data, to the D/A converting unit 13. The D/A converting unit 13 converts the pieces of modulated data, which are delivered from the modulation unit 12, from digital signals to analog signals. Then, the pieces of modulated data, which are now converted to the analog signals, are transmitted through the plurality of antennas 14.

The user terminal 20 receives the pieces of modulated data, which are transmitted from the antennas 14 on the transmission side 10, through the plurality of antennas 24. Note, however, that the pieces of modulated data received by the antennas 24 have been subjected to noise and the like in transmission through space after being output from the antennas 14. The pieces of modulated data received by the antennas 24 are supplied to the A/D converting unit 21. The A/D converting unit 21 converts the supplied pieces of modulated data from the analog signals to the digital signals. The A/D converting unit 21 delivers the digital signals obtained by the conversion to the demodulation unit 22. Then, the demodulation unit 22 demodulates the digital signals delivered from the A/D converting unit 21. The demodulation unit 22 delivers demodulated data, which is obtained by demodulating the digital signals, to the decoding unit (decoding apparatus) 23. The decoding unit (decoding apparatus) 23 performs error correction decoding processing on the supplied demodulated data. The resulting decoded data is used by processing circuits such as a CPU in subsequent stages to perform predetermined processing. Hereinafter, the pieces of modulated data transmitted from the base station 10 on the transmission side is referred to as "transmission data", and the digital signals delivered from the A/D converting unit 21 of the user terminal 20 on the receiving side is referred to as "received data".

The decoding unit (decoding apparatus) 23 computes a plurality of Euclidean distances for the code word candidates of the code words, which are CFIs, from the demodulated data, and decodes the CFIs. The decoding unit (decoding apparatus) 23 computes the plurality of distances only for the number of code word candidates of the code words from the demodulated data, the number being smaller than the number of values the code words can express, the code words having the possibility of being transmitted, and decodes the code words from the plurality of computed distances.

The decoding processing by the decoding unit (decoding apparatus) 23 is described with the use of Equations (4) and (5) below. In this exemplary embodiment, Equations (2) and (3) described above are changed to Equations (4) and (5) below, respectively. In the computation expressed by Equations (2), four Euclidean distances from the code word candidates of the CFIs are determined. However, in the computation expressed by Equations (4) below, the code word candidate corresponding to the CFI having the value of 4 is removed from the distance calculation. This is because the CFI having the value of 4 is never transmitted under the specification of the LTE. The decoding unit (decoding apparatus) 23 computes the plurality of distances only for the number of code word candidates of the code words from the demodulated data as expressed by Equations (4) below, the number being smaller than the number of values the code words can express, the code words having the possibility of being transmitted.

$$P_{CFI1}=A-B-C$$

$$P_{CFI2}=-A+B-C$$

$$P_{CFI3}=-A-B+C \qquad \text{Eqs. (4)}$$

Subsequently, the decoding unit (decoding apparatus) 23 decodes, with the use of the plurality of distances calculated by the computation expressed by Equations (4), the CFI corresponding to the code word candidate having the highest correlation by the computation expressed by Equation (5).

$$CFI = \begin{cases} 1 & \text{if } P_{CFI1} = \text{Max}(P_{CFI1}, P_{CFI2}, P_{CFI3}) \\ 2 & \text{if } P_{CFI2} = \text{Max}(P_{CFI1}, P_{CFI2}, P_{CFI3}) \\ 3 & \text{if } P_{CFI3} = \text{Max}(P_{CFI1}, P_{CFI2}, P_{CFI3}) \end{cases} \qquad \text{Eq. (5)}$$

In other words, upon decoding, the code word candidates corresponding to data that is never transmitted are removed from the subject to be decoded.

Figure 2:
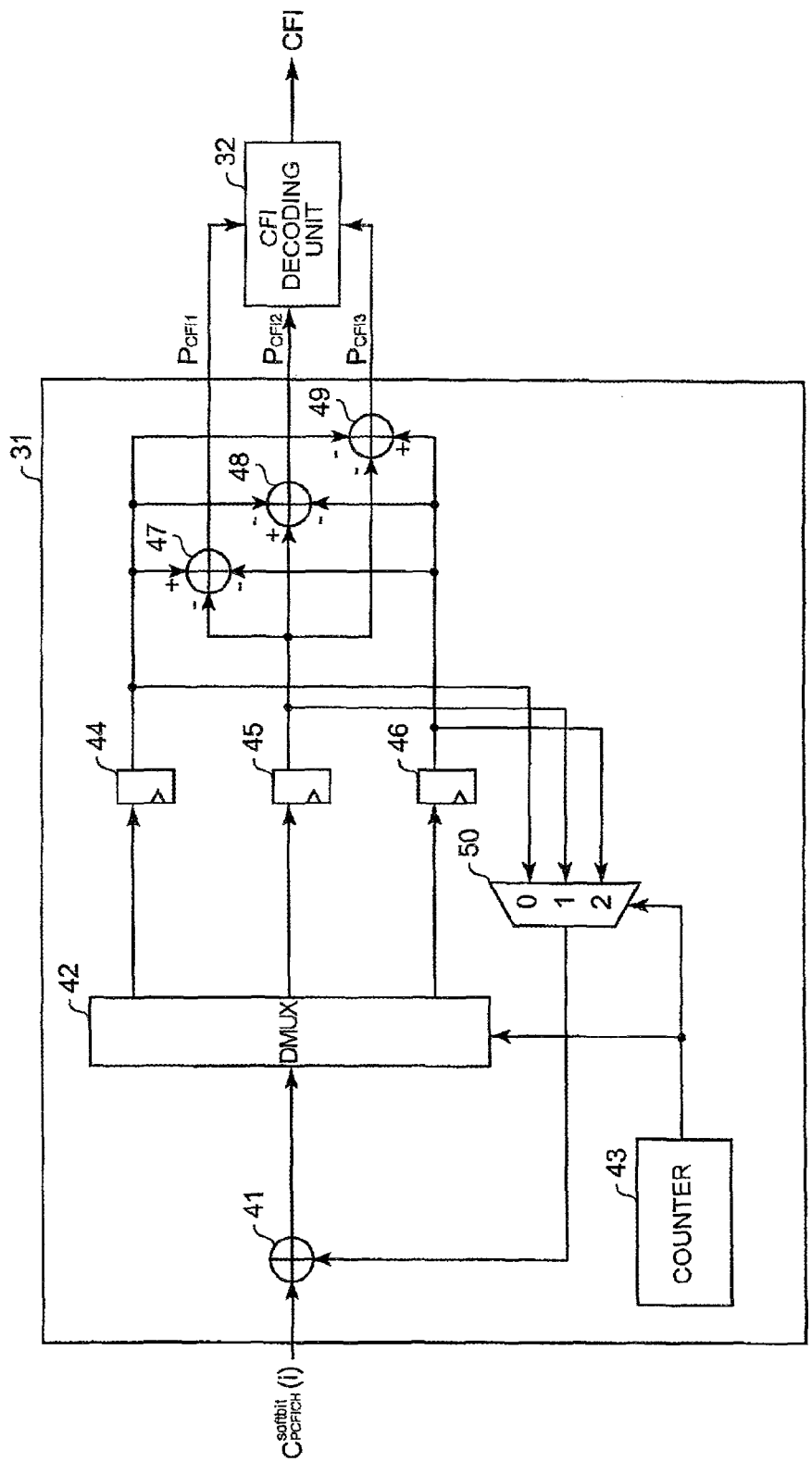
FIG. 2 is a block diagram illustrating an example of a configuration of a decoding unit used in the communication system illustrated in FIG. 1.

FIG. 2 is a block diagram illustrating an example of a configuration of the decoding unit (decoding apparatus) 23. The decoding unit (decoding apparatus) 23 comprises a computing unit 31 and a CFI decoding unit 32. The computing unit 31 computes the plurality of Euclidean distances for the code word candidates of the code words, which are the CFIs, from the demodulated data $C_{PCFICH}^{softbit}(i)$. The CFI decoding unit 32 decodes the CFIs from the plurality of Euclidean distances. Note that, the demodulated data $C_{PCFICH}^{softbit}(i)$ is a 32-bit sequence before decoding of repetition codes and is sequentially supplied from i=0.

The computing unit 31 comprises an adder 41, a demultiplexer (DMUX) 42, a counter 43, a first flip flop 44, a second flip flop 45, a third flip flop 46, a first subtractor 47, a second subtractor 48, a third subtractor 49, and a selector 50.

The adder 41 adds the demodulated data $C_{PCFICH}^{softbit}(i)$ and a value supplied from the selector 50, and supplies the result of addition to the demultiplexer 42. The counter 43 counts up from the initial value of 0 every time 1 bit of the demodulated data $C_{PCFICH}^{softbit}(i)$ is supplied, and supplies the count to the demultiplexer 42 and the selector 50. Note that, the count of the counter 43 returns to 0 subsequent to 2.

The demultiplexer 42 determines, based on the count delivered from the counter 43, which of the first flip flop 44, the second flip flop 45, and the third flip flop 46 is to store the result of addition supplied from the adder 41. Based on the result of determination, the demultiplexer 42 delivers the result of addition supplied from the adder 41 to the determined one of the first flip flop 44, the second flip flop 45, and the third flip flop 46.

The first flip flop 44, the second flip flop 45, and the third flip flop 46 store the decoded repetition codes of the code words of the CFIs, that is, the first to third sums A, B, and C of the respective bits of the code words of the CFIs calculated as in Equations (1), respectively. In other words, the first flip flop 44 stores the first sum A of respective bits of a code word of a CFI. The second flip flop 45 stores the second sum B of respective bits of a code word of a CFI. The third flip flop 46 stores the third sum C of respective bits of a code word of a CFI.

The first flip flop 44, the second flip flop 45, and the third flip flop 46 supply the stored first to third sums A, B, and C of the respective bits of the code words of the CFIs, respectively, to the first subtractor 47, the second subtractor 48, and the third subtractor 49, and to the selector 50.

The first subtractor 47 subtracts, from the first sum A supplied from the first flip flop 44, the second sum B supplied from the second flip flop 45 and the third sum C supplied from the third flip flop 46, and supplies a first Euclidean distance $P_{CFI1}$, which is the difference obtained by the subtraction, to the CFI decoding unit 32. The second subtractor 48 subtracts, from the second sum B supplied from the second flip flop 45, the first sum A supplied from the first flip flop 44 and the third sum C supplied from the third flip flop 46, and supplies a second Euclidean distance $P_{CFI2}$, which is the difference obtained by the subtraction, to the CFI decoding unit 32. The third subtractor 49 subtracts, from the third sum C supplied from the third flip flop 46, the first sum A supplied from the first flip flop 44 and the second sum B supplied from the second flip flop 45, and supplies a third Euclidean distance $P_{CFI3}$, which is the difference obtained by the subtraction, to the CFI decoding unit 32.

In any case, the combination of the first subtractor 47, the second subtractor 48, and the third subtractor 49 serves as a subtraction unit for performing subtraction processing on the first to third sums A, B, and C to determine the first to third Euclidean distances $P_{CFI1}$, $P_{CFI2}$, and $P_{CFI3}$.

The selector 50 discriminates, based on the count output from the counter 43, to which one of the 3 bits of a code word of a CFI the demodulated data $C_{PCFICH}^{softbit}(i)$ corresponds. Based on the result of discrimination, the selector 50 selects outputs of any one of the first flip flop 44, the second flip flop 45, and the third flip flop 46 to be summed The outputs of any one of the first flip flop 44, the second flip flop 45, and the third flip flop 46 selected by the selector 50 are supplied to the adder 41 and hence added to the demodulated data $C_{PCFICH}^{softbit}(i)$.

In any case, the combination of the adder 41, the demultiplexer (DMUX) 42, the counter 43, the first to third flip flops 44, 45, and 46, and the selector 50 serves as an accumulation unit for accumulating the first to third sums A, B, and C from the demodulated data $C_{PCFICH}^{softbit}(i)$.

When the computing unit 31 completes the summing of 32 bits, the first sum A, the second sum B, and the third sum C expressed by Equations (1) are computed, and further the first Euclidean distance $P_{CFI1}$, the second Euclidean distance $P_{CFI2}$, and the third Euclidean distance $P_{CFI3}$ expressed by Equations (4), which are the Euclidean distances from the code word candidates of the CFIs, are calculated.

The CFI decoding unit 32 performs the arithmetic logic expressed by Equation (5) on the first Euclidean distance $P_{CFI1}$, the second Euclidean distance $P_{CFI2}$, and the third Euclidean distance $P_{CFI3}$ to decode the CFIs.

Figure 3:
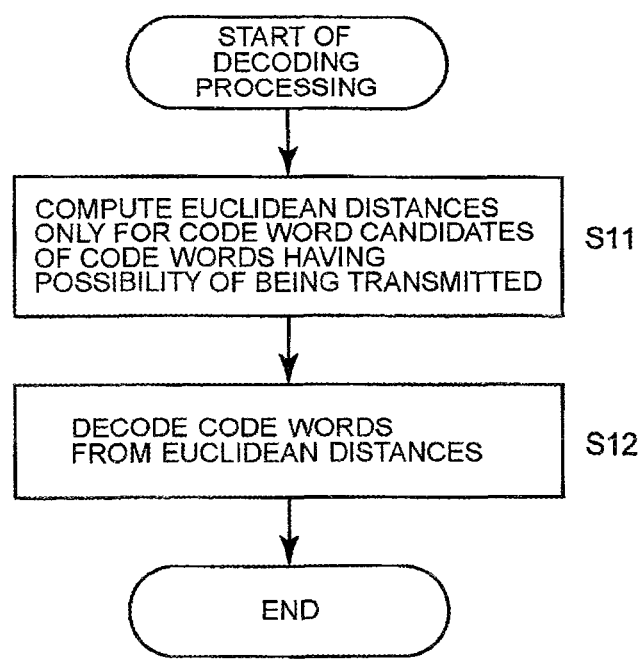
FIG. 3 is a flow chart for describing decoding processing in the decoding unit illustrated in FIG. 2.

FIG. 3 is a flow chart illustrating the decoding processing in the decoding unit (decoding apparatus) 23 illustrated in FIG. 2. In Step S11, the computing unit 31 computes the plurality of Euclidean distances only for the number of code word candidates of the code words from the demodulated data, the number being smaller than the number of values the code words of the CFIs can express, the code words having the possibility of being transmitted. That is, in Step S11, the computing unit 31 computes the plurality of distances only for the number of code word candidates of the code words from the demodulated data, the number being smaller than the number of values the code words can express, the code words having the possibility of being transmitted.

In Step S12, the CFI decoding unit 32 decodes the code words of the CFIs from the plurality of computed Euclidean distances. This completes the decoding processing. That is, in Step S12, the CFI decoding unit 32 decodes the code words from the plurality of computed distances.

As described above, by replacing the computation expressed by Equations (2) by the computation expressed by Equations (4), the number of Euclidean distances to be calculated may be reduced from 4 to 3. Therefore, the circuit scale necessary for decoding may be reduced. Further, by replacing the computation expressed by Equation (3) by the computation expressed by Equation (5), the possibility of calculating the data that is not actually transmitted as the decoding result may be eliminated. As a result, the error rate is improved.

Next, the case of an MBSFN sub-frame is described. In the case of an MBSFN sub-frame, in place of the computation expressed by Equation (5) above, the computation expressed by Equation (6) below is used to decode the CFIs. In this case, the CFI having the value of 3 is removed from the subject to be decoded. This is because, in the case of an MBSFN sub-frame, the CFI having the value of 3 is never transmitted under the specification of the LTE.

$$CFI = \begin{cases} 1 & \text{if } P_{CF11} = \text{Max}(P_{CF11}, P_{CF12}) \\ 2 & \text{if } P_{CF12} = \text{Max}(P_{CF11}, P_{CF12}) \end{cases} \quad \text{Eq. (6)}$$

Figure 4:
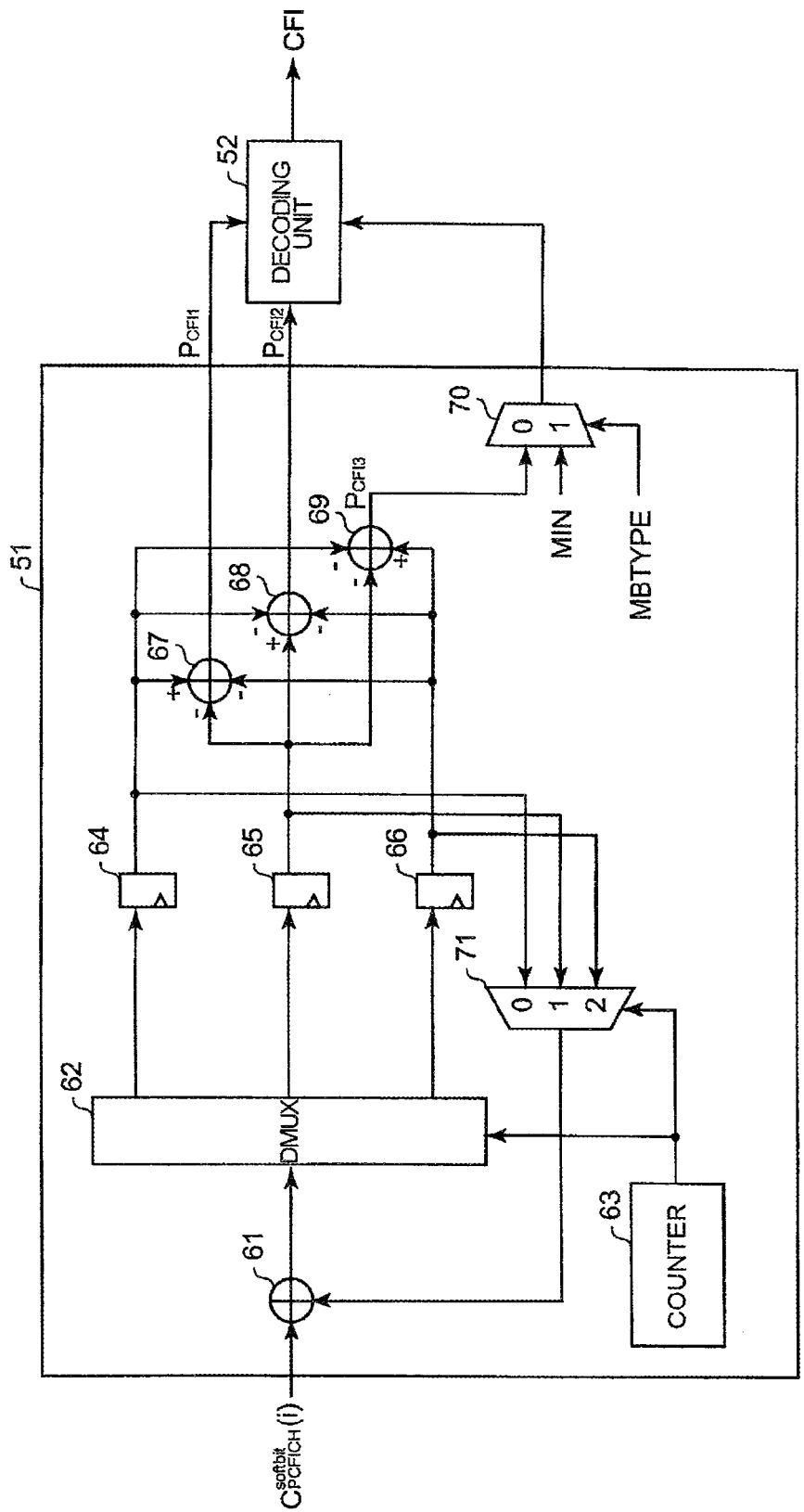
FIG. 4 is a block diagram illustrating another example of the configuration of the decoding unit used in the communication system illustrated in FIG. 1.

FIG. 4 is a block diagram illustrating another example of the configuration of the decoding unit (decoding apparatus) 23 for decoding an MBSFN sub-frame. In the example illustrated in FIG. 4, the decoding unit (decoding apparatus) 23 comprises a computing unit 51 and a CFI decoding unit 52. The computing unit 51 computes the plurality of Euclidean distances for the code word candidates of the code words, which are the CFIs, from the demodulated data $C_{PCFICH}^{softbit}$ (i). The CFI decoding unit 52 decodes the CFIs from the plurality of Euclidean distances.

The computing unit 51 comprises an adder 61, a demultiplexer (DMUX) 62, a counter 63, a first flip flop 64, a second flip flop 65, a third flip flop 66, a first subtractor 67, a second subtractor 68, a third subtractor 69, a first selector 70, and a second selector 71.

The adder 61 adds the demodulated data $C_{PCFICH}^{softbit}$ (i) and a value supplied from the second selector 71, and supplies the result of addition to the demultiplexer 62. The counter 63 counts up from the initial value of 0 every time 1 bit of the demodulated data $C_{PCFICH}^{softbit}$ (i) is supplied, and supplies the count to the demultiplexer 62 and the second selector 71. Note that, the count of the counter 63 returns to 0 subsequent to 2.

The demultiplexer 62 determines, based on the count delivered from the counter 63, which of the first flip flop 64, the second flip flop 65, and the third flip flop 66 is to store the result of addition supplied from the adder 61. Based on the result of determination, the demultiplexer 62 delivers the result of addition supplied from the adder 61 to the determined one of the first flip flop 64, the second flip flop 65, and the third flip flop 66.

The first flip flop 64, the second flip flop 65, and the third flip flop 66 store the decoded repetition codes of the code words of the CFIs, that is, the first to third sums A, B, and C of the respective bits of the code words of the CFIs calculated as in Equations (1), respectively. In other words, the first flip flop 64 stores the first sum A of respective bits of a code word of a CFI. The second flip flop 65 stores the second sum B of respective bits of a code word of a CFI. The third flip flop 66 stores the third sum C of respective bits of a code word of a CFI.

The first flip flop 64, the second flip flop 65, and the third flip flop 66 supply the stored first to third sums A, B, and C of the respective bits of the code words of the CFIs, respectively, to the first subtractor 67, the second subtractor 68, and the third subtractor 69, and to the second selector 71.

The first subtractor 67 subtracts, from the first sum A supplied from the first flip flop 64, the second sum B supplied from the second flip flop 65 and the third sum C supplied from the third flip flop 66, and supplies a first Euclidean distance $P_{CFI1}$, which is the difference obtained by the subtraction, to the CFI decoding unit 52. The second subtractor 68 subtracts, from the second sum B supplied from the second flip flop 65, the first sum A supplied from the first flip flop 64 and the third sum C supplied from the third flip flop 66, and supplies a second Euclidean distance $P_{CFI2}$, which is the difference obtained by the subtraction, to the CFI decoding unit 52. The third subtractor 69 subtracts, from the third sum C supplied from the third flip flop 66, the first sum A supplied from the first flip flop 64 and the second sum B supplied from the second flip flop 65, and supplies a third Euclidean distance $P_{CFI3}$, which is the difference obtained by the subtraction, to the first selector 70.

In any case, the combination of the first subtractor 67, the second subtractor 68, and the third subtractor 69 serves as a subtraction unit for performing subtraction processing on the first to third sums A, B, and C to determine the first to third Euclidean distances $P_{CFI1}$, $P_{CFI2}$, and $P_{CFI3}$.

The first selector 70 replaces, when decoding an MBSFN sub-frame, the third Euclidean distance $P_{CFI3}$ by a minimum value MIN. The minimum value MIN is a predetermined value that is equal to or smaller than the minimum value that the first Euclidean distance $P_{CFI1}$ and the second Euclidean distance $P_{CFI2}$ can take.

An MBTYPE signal supplied to the first selector 70 has a value of 1 when an MBSFN sub-frame is to be decoded, and a value of 0 when an MBSFN sub-frame is not to be decoded (in the case of a non-MBSFN sub-frame (where data other than the MBSFN sub-frame is to be decoded)). Specifically, when the value of the MBTYPE signal is 1, which indicates that an MBSFN sub-frame is to be decoded, the first selector 70 selects the minimum value MIN as the MBSFN sub-frame to be input to the arithmetic logic of Equation (5). When the value of the MBTYPE signal is 0, which indicates that an MBSFN sub-frame is not to be decoded (and a non-MBSFN sub-frame is to be decoded), the first selector 70 selects the third Euclidean distance $P_{CFI3}$ to be input to the arithmetic logic of Equation (5). The minimum value MIN or the third Euclidean distance $P_{CFI3}$ selected by the first selector 70 is supplied to the CFI decoding unit 52.

The second selector 71 discriminates, based on the count supplied from the counter 63, to which one of the 3 bits of a code word of a CFI the demodulated data $C_{PCFICH}^{softbit}$ (i) corresponds. Based on the result of discrimination, the second selector selects outputs of any one of the first flip flop 64, the second flip flop 65, and the third flip flop 66 to be summed. The outputs of any one of the first flip flop 64, the second flip flop 65, and the third flip flop 66 selected by the second selector 71 are supplied to the adder 61 and hence added to the demodulated data $C_{PCFICH}^{softbit}$ (i).

In any case, the combination of the adder 61, the demultiplexer (DMUX) 62, the counter 63, the first to third flip flops 64, 65, and 66, and the second selector 71 serves as an accumulation unit for accumulating the first to third sums A, B, and C from the demodulated data $C_{PCFICH}^{softbit}$ (i).

When the computing unit 51 completes the summing of 32 bits, the first sum A, the second sum B, and the third sum C expressed by Equations (1) are computed. Further, when data other than an MBSFN sub-frame is to be decoded, the computing unit 51 calculates the first Euclidean distance $P_{CFI1}$, the second Euclidean distance $P_{CFI2}$, and the third Euclidean distance $P_{CFI3}$ expressed by Equations (4), which are the Euclidean distances from the code word candidates of the CFIs. When an MBSFN sub-frame is to be decoded, the computing unit 51 calculates the first Euclidean distance $P_{CFI1}$ and the second Euclidean distance $P_{CFI2}$, and the minimum value MIN is delivered in place of the third Euclidean distance $P_{CFI3}$.

When the data other than the MBSFN sub-frame is to be decoded, the CFI decoding unit 52 applies the arithmetic logic expressed by Equation (5) to the first Euclidean distance $P_{CFI1}$, the second Euclidean distance $P_{CFI2}$, and the third Euclidean distance $P_{CFI3}$ to decode the CFIs. When the MBSFN sub-frame is to be decoded, the CFI decoding unit 52 applies the arithmetic logic expressed by Equation (6) to the first Euclidean distance $P_{CFI1}$ and the second Euclidean distance $P_{CFI2}$ to decode the CFIs.

As described above, the circuit scale necessary for decoding may be reduced. Further, the possibility of calculating the data that is not actually transmitted as the decoding result may be eliminated. As a result, the error rate is improved.

Note that, the soft decision decoding has been described as an example. However, hard decision decoding may be adopted without compromising the effects. Further, the case where the plurality of Euclidean distances are computed for the code word candidates has been described as an example. However, a plurality of other distances such as Hamming distances may be computed instead.

The series of processing described above may be executed by hardware or by software. In a case where the series of processing is executed by software, a program constituting the software is installed to a computer embedded to a dedicated hardware or, for example, a general-purpose personal computer capable of executing various functions by installing various programs, from a program recording medium.

Figure 5:
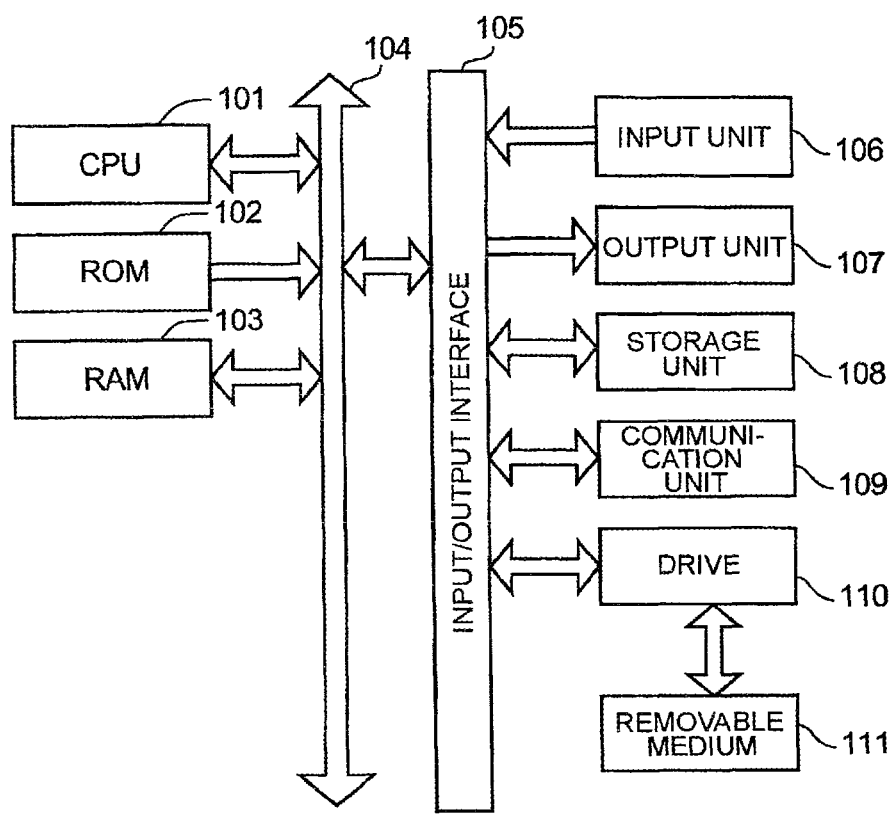
FIG. 5 is a block diagram illustrating a configuration example of hardware of a computer.
Figure 6:
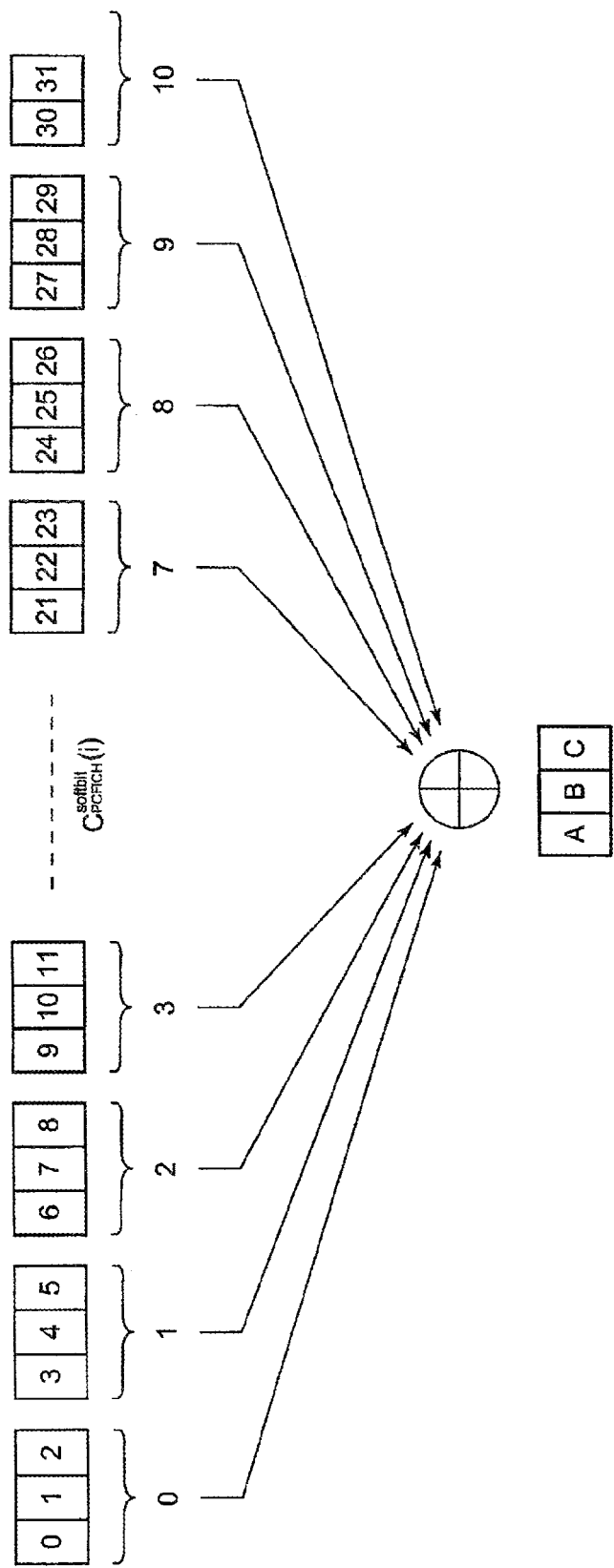
FIG. 6 is a diagram illustrating a CFI that has been converted to repetition codes.

FIG. 5 is a block diagram illustrating a configuration example of hardware of a computer for executing the above-mentioned series of processing with the program.

In the computer, a CPU 101, a read only memory (ROM) 102, and a random access memory (RAM) 103 are interconnected by a bus 104.

The bus 104 is further connected to an input/output interface 105. The input/output interface 105 is connected to an input unit 106 including a keyboard, a mouse, a microphone, and the like, an output unit 107 including a display, a loudspeaker, and the like, a storage unit 108 including a hard disk, a non-volatile memory, and the like, a communication unit 109 including a network interface and the like, and a drive 110 for driving a removable medium 111 such as a magnetic disk, an optical disc, a magneto-optical disk, or a semiconductor memory.

In the computer configured as above, the CPU 101 loads a program stored in the storage unit 108, for example, onto the RAM 103 via the input/output interface 105 and the bus 104 and executes the program, to thereby perform the above-mentioned series of processing.

The program executed by the computer (CPU 101) is provided by being recorded on the removable medium 111, which is a package medium including a magnetic disk (including flexible disk), an optical disc (such as compact disc-read only memory (CD-ROM) or digital versatile disc (DVD)), a magneto-optical disk, or a semiconductor memory, for example, or through a wired or wireless transmission medium such as a local area network, the Internet, or digital satellite broadcasting.

The program may be installed on the computer by placing the removable medium 111 in the drive 110 and storing the program in the storage unit 108 through the input/output interface 105. Alternatively, the program may be installed on the computer by receiving the program by the communication unit 109 through a wired or wireless transmission medium and storing the program in the storage unit 108. Yet alternatively, the program may be preinstalled on the computer by previously storing the program in the ROM 102 or in the storage unit 108.

Note that, the program executed by the computer may be a program in which the processing is performed in the chronological order described herein, or a program in which the processing is performed in parallel or at necessary timing such as when invoked.

More specific aspects (exemplary embodiments) of this invention are described.

In the decoding apparatus of an aspect (exemplary embodiment) of this invention, in addition to the above-mentioned configuration, the computing unit computes the plurality of Euclidean distances for the code word candidates of the code words, which are the CFIs, from the demodulated data, and the decoding unit decodes the CFIs from the plurality of Euclidean distances.

Further, in the decoding apparatus of an aspect (exemplary embodiment) of this invention, in addition to the above-mentioned configuration, the computing unit replaces the code word candidate of the code word having no possibility of being transmitted with the predetermined minimum value.

In addition, a decoding method of an aspect (exemplary embodiment) of this invention includes a computing step of computing a plurality of distances only for the number of code word candidates of code words from demodulated data, the number being smaller than the number of values the code words can express, the code words having the possibility of being transmitted, and a decoding step of decoding the code words from the plurality of computed distances.

Further, a recording medium of an aspect (exemplary embodiment) of this invention has recorded thereon a program to be executed by a computer of the decoding apparatus, the program causing the computer to perform a computing procedure of computing a plurality of distances only for the number of code word candidates of code words from demodulated data, the number being smaller than the number of values the code words can express, the code words having the possibility of being transmitted, and decoding processing of decoding the code words from the plurality of computed distances.

While the invention has been particularly shown and described with reference to exemplary embodiments thereof, the invention is not limited to the these embodiments. It will be understood by those of ordinary skill in the art that various changes in form and details may be made therein without departing from the spirit and scope of the present invention as defined by the claims.

This application is based upon and claims the benefit of priority from Japanese Patent Application No. 2009-239330, filed on Oct. 16, 2009, the disclosure of which is incorporated herein in its entirety by reference.

The invention claimed is:

1. A decoding apparatus comprising:
   a computing unit that computes a plurality of Euclidean distances only for a number of code word candidates of code words, which are control format indicators (CFIs), from demodulated data, the number being smaller than a number of values the code words can express, the code words having a possibility of being transmitted; and
   a decoding unit that decodes the CFIS from the plurality of Euclidean distances,
   wherein the computing unit comprises:
   an accumulation unit for accumulating a first sum, a second sum, and a third sum from the demodulated data; and
   a subtraction unit for performing subtraction processing on the first sum, the second sum, and the third sum to determine a first Euclidean distance, a second Euclidean distance, and a third Euclidean distance.

2. The decoding apparatus according to claim 1, wherein the subtraction unit comprises:
   a first subtractor for subtracting the second sum and the third sum from the first sum to determine the first Euclidean distance;
   a second subtractor for subtracting the first sum and the third sum from the second sum to determine the second Euclidean distance; and a third subtractor for subtracting the first sum and the second sum from the third sum to determine the third Euclidean distance.

3. The decoding apparatus according to claim 1, wherein the computing unit replaces the code word candidate for the code word having no possibility of being transmitted by a predetermined minimum value.

4. A decoding apparatus comprising:
a computing unit for computing a plurality of distances for code word candidates of code words from demodulated data; and
a decoding unit for decoding the code words from the plurality of computed distances,
wherein the computing unit computes a plurality of Euclidean distances for the code word candidates of the code words, which are control format indicators (CFIs), from the demodulated data, and replaces one of the plurality of Euclidean distances by the predetermined minimum value, and
wherein the decoding unit decodes the CFIs from the predetermined minimum value, which has replaced, and the plurality of Euclidean distances, which have not been replaced.

5. The decoding apparatus according to claim 4, wherein the computing unit comprises:
an accumulation unit for accumulating a first sum, a second sum, and a third sum from the demodulated data;
a subtraction unit for performing subtraction processing on the first sum, the second sum, and the third sum to determine a first Euclidean distance, a second Euclidean distance, and a third Euclidean distance; and
a selector for selecting any one of the third Euclidean distance and the predetermined minimum value.

6. The decoding apparatus according to claim 5, wherein the subtraction unit comprises:
a first subtractor for subtracting the second sum and the third sum from the first sum to determine the first Euclidean distance;
a second subtractor for subtracting the first sum and the third sum from the second sum to determine the second Euclidean distance; and
a third subtractor for subtracting the first sum and the second sum from the third sum to determine the third Euclidean distance.

7. A decoding method, comprising:
computing a plurality of distances for code word candidates of code words from demodulated data; and
decoding the code words from the plurality of computed distances,
wherein the computing comprises computing a plurality of Euclidean distances for the code word candidates of the code words, which are control format indicators (CFIs), from the demodulated data, and replacing one of the plurality of Euclidean distances by a predetermined minimum value, and
wherein the decoding comprises decoding the CFIs from the predetermined minimum value, which has replaced, and the plurality of Euclidean distances, which have not been replaced.

8. A non-transitory computer readable recording medium having recorded thereon a program to be executed by a computer of a decoding apparatus, the program causing the computer to perform:
computing processing of computing a plurality of distances for code word candidates of code words from demodulated data; and
decoding processing of decoding the code words from the plurality of computed distances,
wherein the computing processing comprises computing a plurality of Euclidean distances for the code word candidates of the code words, which are control format indicators (CFIs), from the demodulated data, and replacing one of the plurality of Euclidean distances by a predetermined minimum value, and
wherein the decoding processing comprises decoding the CFIs from the predetermined minimum value, which has replaced, and the plurality of Euclidean distances, which have not been replaced.

* * * * *